INVENTOR.
JACQUES P. VANIER
BY
ATTORNEY

INVENTOR.
JACQUES P. VANIER
BY
ATTORNEY 3,435,369

TUNING OF ATOMIC MASERS BY MAGNETIC QUENCHING USING TRANSVERSE MAGNETIC FIELDS

Jacques P. Vanier, Beverly, Mass., assignor, by mesne assignments, to Hewlett-Packard Company, Palo Alto, Calif., a corporation of California Filed Mar. 4, 1966, Ser. No. 531,984
Int. Cl. G01r 33/08; H01s 1/06
U.S. Cl. 331—94 6 Claims

ABSTRACT OF THE DISCLOSURE

An atomic maser is slightly detuned by a modulated signal produced by a pair of coils adjacent to the maser bounce box or by a conductor wire disposed in the center of the bounce box. The modulated signal is applied transversely to the low intensity polarizing field and is generated by a noise source which induces random Zeeman transitions.

Figure 1:
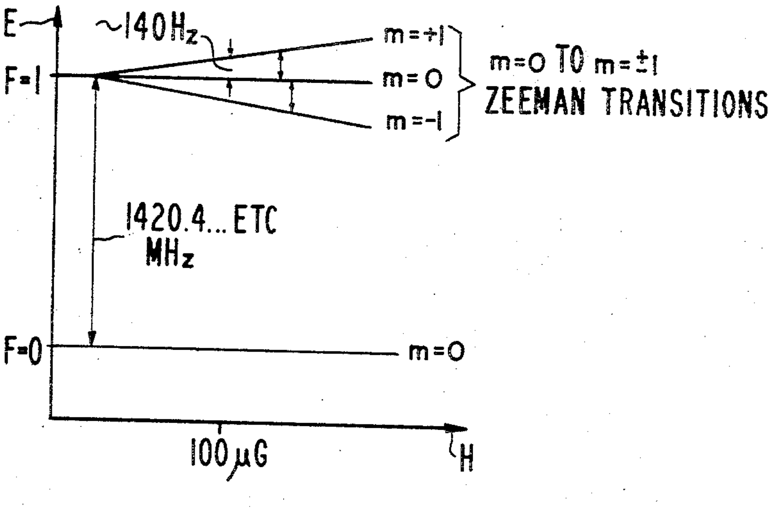

The present invention relates in general to tuning of atomic masers and, more particularly, to an improved method and apparatus for tuning resonator circuits of atomic masers to precisely the natural atomic resonance frequency by application of predominately transverse magnetic field components to the atomic resonant bodies, whereby the magnetic field independent resonance is not substantially magnetically tuned. Such improved tuning is especially useful for tuning of hydrogen and rubidium masers which are employed as frequency standards or atomic clocks.

Heretofore periodic magnetic quenching, i.e., magnetic line broadening, of the atomic resonance line has been used for detecting the amount of circuit pulling, i.e., detuning of the natural atomic resonance line of an atomic maser by the coupled resonant circuit, such that this circuit pulling effect could be corrected by tuning the cavity. Such a tuning system is described and claimed in copending U.S. application 456,246, filed May 17, 1965, now abandoned.

In this prior system a linear magnetic field gradient was introduced over the ensemble of atomic resonator bodies by a pair of bucking connected Helmholtz coils axially aligned with the small magnetic polarizing field in the cavity of an atomic hydrogen maser of the type described and claimed in copending U.S. application 142,356, filed Oct. 2, 1961, now Patent No. 3,255,423, issued June 7, 1966, and assigned to the same assignee as the present invention. The linear gradient was applied as a 1 Hz. modulation and produced a 1 Hz. cavity pulling sideband signal on the output carrier wave of the maser. This sideband signal was phase detected and used in a closed loop automatic cavity tuning circuit.

Although the automatic sideband tuning system was found to operate satisfactorily for some applications, it was found to introduce a minute tuning error on the order of one part in $10^{12}$ of the output frequency at 1420.4 . . . etc. mHz. For extremely precise frequency standards and atomic clocks it is desirable to reduce this automatic tuning error to less than one part in $10^{13}$.

The mechanism involved in producing the line broadening by the applied linear gradient is not, as one might suspect, predominately a matter of broadening the magnetic field splitting of the upper hyperfine $m=0$ energy level which defines the field independent transition. While such an effect is present, its magnitude is on the order of one part in $10^{14}$ for the magnitude of the magnetic field gradients used and, therefore, is negligible. Rather the line broadening obtained is due to inducing random transitions between the various possible Zeeman levels of the upper hyperfine level, i.e., ($m=\mp1$ to $m=0$) whereby the average life time of the atoms in the upper $m=0$ hyperfine energy level is reduced, thereby increasing their effective relaxation rate and increasing the observed natural resonance line width.

These Zeeman transitions are induced because the prior pair of bucking Helmholtz coils did not produce a pure gradient in the direction of the polarizing magnetic field but also produced a smaller linear gradient in the transverse direction. This linear gradient in the transverse direction is produced by a transverse field component $H_t$ which changes in magnitude away from the axial centerline of the Helmholtz coil. The atoms, which are randomly bouncing about in the box, rapidly traverse this spatial dependent transverse field component and as a consequence see a small Fourier component of the transverse field at the frequency of the Zeeman transitions ($m=0$ to $m=\pm1$). This Zeeman frequency is about 140 Hz. at a polarizing field intensity of 100 $\mu$g. These Zeeman transitions are randomly induced because of the random nature of the trajectories of the bouncing atoms. Thus the 1 Hz. gradient modulation produces a 1 Hz. line broadening component by stimulating transitions to and from the ($F=1$, $m=0$) level thereby decreasing the average life time of atoms in this level.

The problem with the prior Helmholtz gradient coil system was that it produced as much magnetic field component in the direction of the polarizing magnetic field as it did transverse to the polarizing field. The component in the direction of the polarizing field represented excess magnetic field since it did not induce Zeeman transitions. Moreover, the linear gradient was not efficient in producing Fourier components at the Zeeman transition frequency. For example, a 1000 $\mu$g. variation in the magnetic field intensity across the volume of the atom bounce box was required to produce sufficient line broadening for automatic tuning. The excess produced magnetic field and the inefficient utilization of the transverse field component combined to produce the undesired magnetic tuning error in the natural resonant frequency of the atomic resonators.

This magnetic tuning error arises because the natural resonant frequency of the atomic resonators is magnetically detuned according to the volume average of the square of the magnetic field. For atomic hydrogen the expression for detuning is:

$$\Delta f=2750\langle H^2\rangle_{\text{Avg.}}^{\text{Vol.}} \quad (1)$$

Thus, for a 1000 $\mu$g. gradient we can expect magnetic detuning, disregarding cavity pulling, by as much as two parts in $10^{12}$. This amount of detuning is excessive for some precise frequency standards and accordingly is to be eliminated if possible. Incidentally, the random character of the Zeeman transitions is essential for if they are produced in a coherent manner, as by application of a coherent magnetic field at the Zeeman frequency, a strong frequency pulling effect will occur which will mask out the desired cavity pulling effect.

In the present invention, method and apparatus are provided for producing random Zeeman level transitions without introducing excessive magnetic field over the ensemble of atomic resonators, whereby the undesired magnetic detuning is eliminated. In one preferred embodiment of the present invention, the line broadening random Zeeman transitions of the atomic resonators are induced by applying a noise magnetic field transverse to the polarizing magnetic field with noise component frequencies at the Zeeman transition frequencies. In another embodiment of the present invention, the random Zeeman level transitions are induced by applying a substantially pure transverse magnetic field having a rapidly varying spatial dependence over the ensemble of atomic resonators, whereby Fourier components for line broadening are produced without introducing excessive magnetic detuning of the natural atomic resonance line.

The principal object of the present invention is the provision of improved methods and apparatus for tuning of atomic masers, whereby, unwanted detuning effects are minimized.

One feature of the present invention is the provision of means for producing a predominately transverse magnetic field component over the ensemble of atomic resonators for line broadening by inducing random Zeeman level transitions, whereby magnetic detuning effects are minimized.

Another feature of the present invention is the provision of means for applying a noise magnetic field component, at the Zeeman transition frequency, to the ensemble of atomic resonators, whereby the atomic resonance line is broadened without introducing excessive magnetic detuning of the natural atomic resonance line frequency.

Another feature of the present invention is the same as any one or more of the preceding wherein the applied Zeeman transition inducing magnetic field is predominately transverse to the direction of the polarizing magnetic field and has a spatial dependence over the ensemble of atomic resonators which has a slope with a magnitude greater than three.

Another feature of the present invention is the same as the preceding feature wherein the Zeeman transition magnetic field is produced by a length of current carrying conductor directed parallel to the direction of the polarizing magnetic field.

Figure 2:
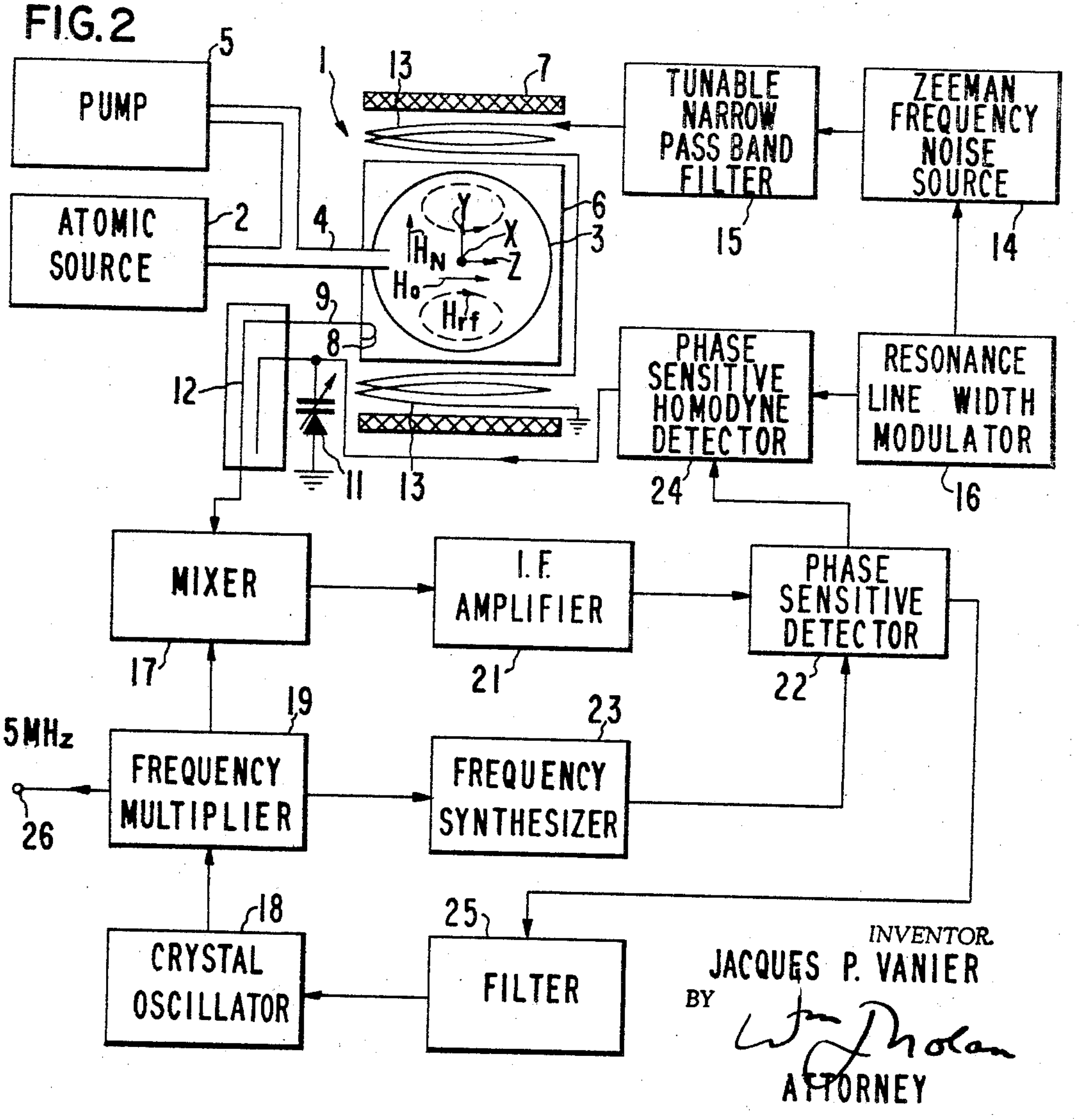
Figures 3, 4, 5, 6:
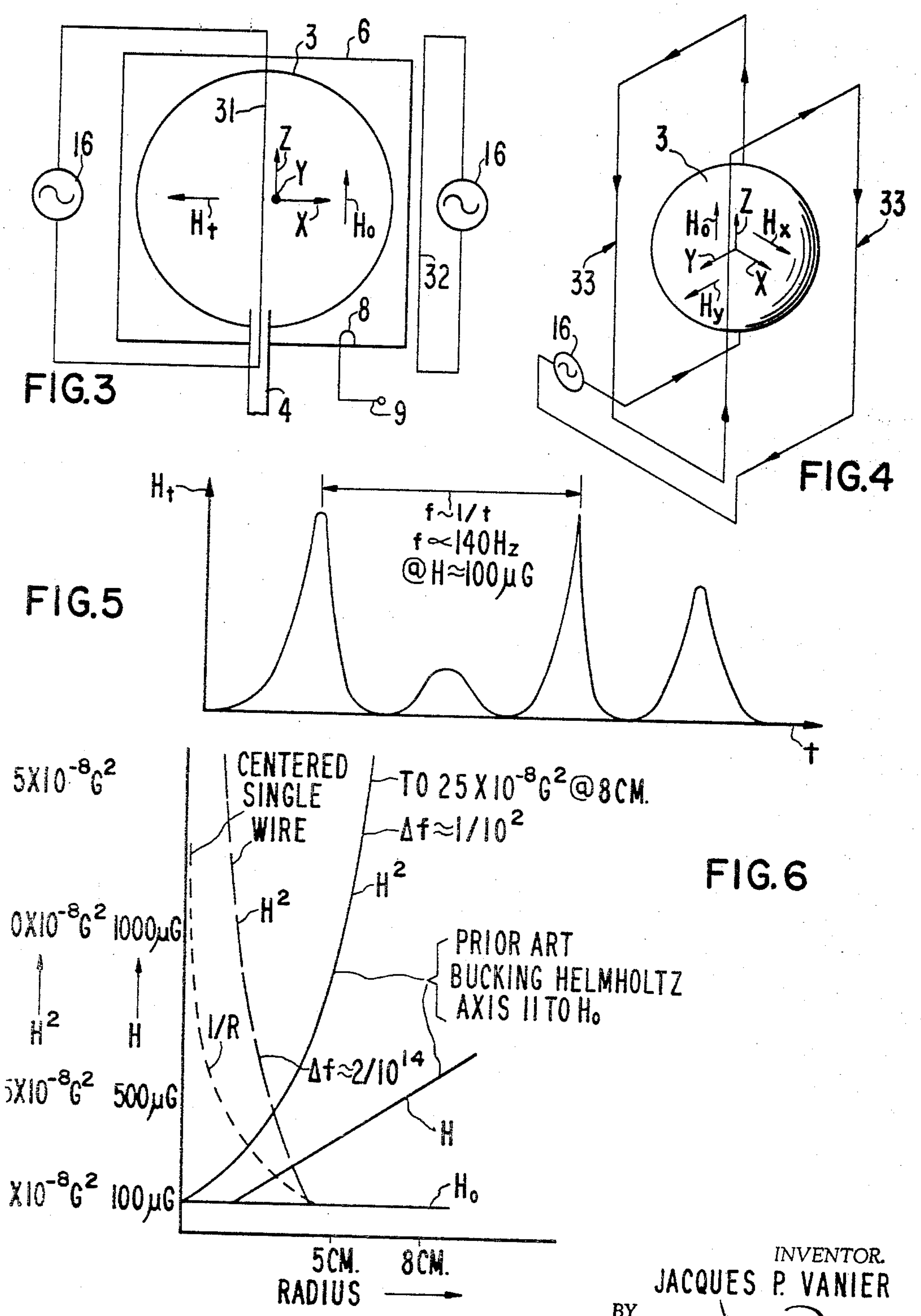

Other features and advantages of the present invention will become apparent upon a perusal of the following specification taken in connection with the accompanying drawings wherein:

FIG. 1 is an energy level diagram for a hyperfine atomic resonator system plotted against small values of magnetic field showing the Zeeman line splitting, FIG. 2 is a schematic block diagram of an atomic maser employing the tuning features of the present invention, FIGS. 3 and 4 are schematic line diagrams of a maser cavity employing alternative line broadening embodiments of the present invention, FIG. 5 is a plot of transverse magnetic field $H_t$ versus time as seen from the reference point of a moving atom bouncing about in the bounce box of FIG. 3, and FIG. 6 is a plot of magnetic field intensity H and field intensity squared $H^2$ versus radius out from the axis of symmetry of a spherical bounce box for two gradient coil arrangements.

Referring now to FIG. 1 there is shown an energy level diagram for an atomic hydrogen maser. The maser operates on the ($F=1$, $m=0$ to $F=0$, $m=0$) magnetic hyperfine transition of atomic hydrogen which occurs at 1,420.4 . . . etc. mHz. A small polarizing or quantizing magnetic field $H_o$ as of 100 $\mu$g. is applied to the atomic hydrogen resonators to provide sufficient Zeeman splitting such that operation can be obtained on the pure aforementioned field independent transition.

Automatic tuning of hydrogen masers by introducing a periodic line broadening of the atomic resonance line is described and claimed in the above cited U.S. patent application 456,246, now abandoned. Suffice it to say that in the prior magnetic quenching method of line broadening of the hydrogen maser line, the line was actually broadened by stimulating random Zeeman transitions between the ($F=1$), ($m=0$) level and the ($F=1$), ($m=\pm1$) levels. The reason why stimulation of these Zeeman transitions broadens the hyperfine line is that as a consequence of these transitions the life time of the atoms in the ($F=1$, $m=0$) level is reduced thereby increasing their observed relaxation rates and thus broadening the atomic resonance line. These Zeeman transitions occur at the resonant frequency of the unpaired electron which is 1.4 mHz./g. Thus, in a polarizing field of 100 $\mu$g. the Zeeman resonant frequency is approximately 140 Hz.

In a preferred embodiment of the present invention, the random Zeeman transitions for line broadening are produced by applying a variable band of noise magnetic field $H_n$, at the Zeeman frequency, to the ensemble of atomic resonators. The noise field $H_n$ is applied with a substantial component of the noise field $H_n$ at right angles to the polarizing field $H_o$.

Referring now to FIG. 2, there is shown an atomic maser with an automatic tuning system employing features of the present invention, whereby the maser cavity is tuned precisely to the natural resonance line frequency and tuning errors are eliminated. The system includes a conventional maser 1 such as, for example, a hydrogen maser as described in the aforecited Patent No. 3,255,423. As an alternative, a rubidium beam maser could be employed. The maser 1 includes a source 2 of gaseous atoms in an elevated energy state. For hydrogen, this is the $F=1$, $m=0$ state. For rubidium, this is the $F=2$, $m=0$ state. The upper energy state atoms are projected, at thermal velocities, into a bounce box 3 through a pipe 4. The bounce box 3 is made of a low loss tangent dielectric material coated on its inside surfaces with a hyperfine energy state non-relaxing material such as tetrafluoroethylene resin. The bounce box 3 and pipe 4 are evacuated via pump 5 to a low pressure such that the mean free path for atoms within the bounce box 3 is at least on the order of, and preferably much longer than, the characteristic transverse dimensions of the bounce box, typically a sphere 16 cm. in diameter.

A high Q cavity resonator 6, such as a cylindrical cavity, surrounds the bounce box 3 and supports a high Q mode of resonance such as the $TE_o$, 1, 1 mode at the hyperfine resonance frequency with the uniform central region of the r.f. magnetic field $H_{r.f.}$ of the cavity mode aligned in the Z direction. A solenoid 7 surrounds the bounce box 3 and cavity 6 and provides a low intensity polarizing or quantizing magnetic field $H_o$, as of 100 $\mu$g., throughout the bulb and parallel to the Z axis.

Spontaneous emission of radiation from the upper energy state atoms in the cavity 6 produces a $TE_o$, 1, 1 mode current in the walls of the cavity resonator 6 which current interacts back, through its associated magnetic, r.f. field component, to stimulate further coherent emission of radiation from the ensemble of atomic resonators and the system goes into sustained oscillation. The beam of atoms from the source 2 continually supplies the upper energy state atoms which relax in the process. An output signal, at the hyperfine resonance frequency, is extracted from the cavity via a coupling loop 8 and coaxial line 9. A tuning diode 11 is coupled to the cavity 6 through a directional coupler 12 for reflecting a voltage variable reactance into the cavity 6 for voltage tuning thereof.

A variable line broadening system is employed for periodically broadening the natural resonance line of the atomic resonators for introducing onto the maser output signal a cavity pulling sideband component. This sideband component is used in an automatic cavity tuning system which is fully described in the above cited abandoned application S.N. 456,246 and which will be briefly described herein.

The line broadening system includes a pair of series connected magnetic aiding coils 13 wound about an axis transverse to the Z axis such as, for example, the Y axis. The coils 13 are energized with noise energy covering a tunable narrow band as of 20 Hz. centered at the Zeeman transition frequency as of, for example, 140 Hz. at $H_o$ of 100 $\mu$g. The noise magnetic field $H_n$, produced by coils 13, over the ensemble of atomic resonators is transverse to the polarizing field $H_o$ and induces random Zeeman transitions, thereby broadening the natural field independent atomic resonance line of the maser.

The line broadening noise coils 13 are supplied with noise current from a Zeeman frequency noise source 14. The noise source 14 may comprise, for example, a high gain 0–10 kHz. Hi-Fi audio amplifier having its input terminated in a resistive load and feeding a current gain transformer. The high current output of the transformer is fed to a tunable narrow pass band filter 15. The center frequency of the pass band of the filter 15 is designed to be tunable over the expected range of Zeeman transitions for a given polarizing magnetic field intensity $H_o$. Typically, the pass band of the filter 15 would be 10–20 Hz. centered around 200 Hz. The noise current passed by the filter 15 is applied to the noise coils 13 for broadening the maser output resonance line. A resonance line width modulator 16 modulates the output of the noise source at a conveniently low frequency as of 1 Hz. to produce a 1 Hz. cavity pulling component on the output carrier signal of the maser. This cavity pulling component is used for eliminating the cavity pulling effect in the manner as fully described in the above cited abandoned U.S. application 456,246, and briefly described herein.

The output of the maser at, for example, 1420.4 . . . etc. mHz. is fed a mixer 17 wherein it is mixed with a signal at 1,400 . . . etc. mHz. derived from a crystal oscillator 18 at 5 mHz. and as multiplied in multiplier 19 to produce a convenient intermediate frequency I.F. as of 20.4000 . . . etc. mHz. The I.F. is amplified in I.F. amplifier 21 and fed to one input terminal of a phase sensitive detector 22 wherein it is compared with a signal at precisely the same predetermined intermediate frequency of 20.4000 . . . etc. mHz. as derived from a frequency synthesizer 23.

The output of the phase sensitive detector 22 includes an F.M. detected A.M. component of the atomic resonance line at the 1 Hz. line width modulation frequency. This component is fed to one input terminal of a phase sensitive homodyne detector 24 wherein it is compared with a sample of the line width modulation signal to produce a D.C. error signal, i.e., band pass less than 0.1 Hz. with a phase and magnitude dependent upon the phase and magnitude of the cavity pulling on the natural atomic resonance line of the maser. This error signal is fed to the tuning diode for tuning the cavity 6 to precisely the center of the natural atomic resonance line to eliminate tuning errors.

Slight drift or frequency shift of the crystal oscillator 18 is corrected by feeding back a portion of the output of the phase sensitive detector 22 to the frequency control terminal of the crystal oscillator 18. A low pass filter 25, having a high frequency cut off of about 0.01 Hz., is placed in the feedback path to the crystal oscillator 18. The feedback path locks the phase of crystal oscillator 18 into a phase locked relationship with the phase of the maser carrier signal. A 5 mHz. output is extracted from the crystal oscillator 18 at terminal 26.

Referring now to FIG. 3, there is shown an alternative embodiment of the present invention wherein the random Zeeman transitions, which account for the line broadening, are produced by Fourier components of an applied transverse field as seen by the moving reference point of the bouncing atomic resonators. In this embodiment, a tetrafluoroethylene resin coated wire 31 is threaded through the bounce box 3 and cavity 6 such that it passes parallel to the direction of the polarizing magnetic field $H_o$ and essentially along the center axis of the cylindrical cavity resonator 6. The wire 31 is energized with suitable current as of 0.7 ma. maximum to produce essentially only a transverse field $H_t$ within the bounce box 3.

The field produced by the wire falls off in the direction away from the wire according to the relation, $$H_t \alpha \frac{1}{R}$$

A plot of the $1/R$ field in an 8 cm. radius bounce box

3 is shown in FIG. 6 and it can be seen that the field has a very steep transverse gradient near the wire with a relatively low volume average of $H_t^2$. As was stated earlier in Equation 1, the magnetic detuning $\Delta f$ of the field independent hyperfine transition for atomic hydrogen is proportional to the volume average of the field squared. For the single center wire with a maximum current of 0.7 ma. in an 8 cm. radius bounce bulb 3, the magnetic detuning is only 2 parts in $10^{14}$. However, this single wire 31, as energized from the line width modulator 16, produced sufficient line broadening to produce a readily detectable cavity pulling component on the atomic resonance line of the maser 1.

It is believed that the mechanism for producing line broadening by the single wire is as shown in FIG. 5. In FIG. 5 the transverse field component $H_t$ is plotted as a function of time $t$ as seen by the moving reference of a randomly bouncing atom traveling within the bounce box 3 at thermal velocities. From FIG. 6 it is seen that the transverse field has a sharply defined peak near the center of the bulb 3 which is accompanied by a steep slope or gradient. As a consequence, the bouncing atom sees a rapidly time varying random magnetic field $H_t$ at right angles to the polarizing magnetic field $H_o$. This randomly and rapidly varying transverse field component will have frequency components, with random phases, covering a substantial bandwidth including the Zeeman transition frequencies of approximately 140 Hz. at a polarizing field intensity of 100 $\mu$g. Thus, these Zeeman transitions are induced with random noise like phase relationship to produce line broadening of the hyperfine resonance line. The line width is modulated by modulating the current through the inductor 31 as derived from the line width modulator 16.

As an alternative, the length of transverse field producing conductor need not pass through the center of the bulb 3 and cavity 6, but may pass just inside or outside of the cavity wall: Such an example is shown by conductor 32 of FIG. 3.

Still another embodiment of the present invention is shown in FIG. 4 wherein essentially a pure transverse field $H_t$ is produced by a pair of series connected magnetic bucking coils 33. The coils 33 are elongated in the direction of the polarizing magnetic field $H_o$ to remove the end portions of the coils 33 from the bulb 3 so that the non-transverse field components, produced by the end sections, are removed from the bulb 3. As before, the coils 33 are energized from the line width modulator 16 and may be placed inside or outside of the walls of the cavity resonator 60.

What is claimed is:

1. An atomic resonance apparatus comprising: means forming a bounce box for containing an ensemble of atomic resonators in a gaseous state at a reduced pressure such that the mean free path length of the gaseous atoms is at least on the order of the characteristic transverse dimension of said container means, means providing a low intensity magnetic field for polarizing said ensemble of atomic resonators, means forming a resonant circuit electromagnetically coupled to the ensemble of atomic resonators and tuned to substantially the natural atomic hyperfine resonant frequency of the atomic resonators for receiving electromagnetic wave energy from the ensemble and means for applying a variable second magnetic field gradient predominately at right angles to the direction of the polarizing magnetic field for inducing random Zeeman resonance of the atomic resonators in the polarizing magnetic field, whereby the natural hyperfine resonance line width of the atomic resonators is variably broadened to produce a resonant circuit frequency pulling output component on the hyperfine resonance of the atomic resonators.

2. The apparatus according to claim 1 including means for detecting the frequency pulling output component and tuning the resonant frequency of said coupled resonant circuit to the frequency of the natural hyperfine resonance of the atomic resonators to eliminate the frequency pulling.

3. The apparatus according to claim 1 wherein said means applying the second magnetic field includes a noise generator means for producing a band of noise at the Zeeman transition frequency over the ensemble of atomic resonators for inducing the random Zeeman resonance.

4. The apparatus according to claim 1 wherein said means for applying the second magnetic field gradient includes a length of conductor directed parallel to the direction of the polarizing magnetic field.

5. An atomic resonance apparatus comprising: means forming a bounce box for containing an ensemble of atomic resonators in a gaseous state at a reduced pressure such that the mean free path length of the gaseous atoms is at least on the order of the characteristic transverse dimensions of said container means, means providing a low intensity magnetic field for polarizing said ensemble of atomic resonators, means forming a resonant circuit electromagnetically coupled to the ensemble of atomic resonators and tuned to substantially the natural atomic hyperfine resonance frequency of the atomic resonators for receiving electromagnetic wave energy from the ensemble, means for generating and applying a noise magnetic field with a substantial component at right angles to the polarizing magnetic field and containing random noise components covering a frequency band for inducing random Zeeman resonance of the atomic resonators in the polarizing magnetic field, whereby the random Zeeman transitions broaden the natural hyperfine resonance linewidth of the atomic resonators and produce a resonant circuit frequency pulling output component on the hyperfine resonance of the atomic resonators.

6. The apparatus according to claim 5 including means for detecting the frequency pulling output component and tuning the resonant frequency of said coupled resonant circuit to the frequency of the natural hyperfine resonance of the atomic resonators to eliminate frequency pulling.

References Cited

UNITED STATES PATENTS

| | | | |
|---|---|---|---|
| 2,926,310 | 2/1960 | Winkler | 331—3 |
| 2,933,696 | 4/1960 | Reder | 331—3 |
| 3,159,797 | 12/1964 | Whitehorn | 331—3 |
| 3,373,348 | 3/1968 | Vanier | 324—5 |

RUDOLPH V. ROLENIC, *Primary Examiner.*

MICHAEL J. LYNCH, *Assistant Examiner.*

U.S. Cl. X.R.

324—.5; 331—3